(12) United States Patent
Wu

(10) Patent No.: US 7,129,574 B2
(45) Date of Patent: *Oct. 31, 2006

(54) MULTI-POWER RING CHIP SCALE PACKAGE FOR SYSTEM LEVEL INTEGRATION

(75) Inventor: Ping Wu, Cupertino, CA (US)

(73) Assignee: Broadcom Corporation, Irvine, CA (US)

( * ) Notice: Subject to any disclaimer, the term of this patent is extended or adjusted under 35 U.S.C. 154(b) by 158 days.

This patent is subject to a terminal disclaimer.

(21) Appl. No.: 10/884,055

(22) Filed: Jul. 2, 2004

(65) Prior Publication Data

US 2004/0238939 A1 Dec. 2, 2004

Related U.S. Application Data

(63) Continuation of application No. 09/754,900, filed on Jan. 4, 2001, now Pat. No. 6,770,963.

(51) Int. Cl.
*H01L 23/52* (2006.01)

(52) U.S. Cl. ...................... 257/691; 257/784

(58) Field of Classification Search ................ 257/691, 257/664, 676, 784
See application file for complete search history.

(56) References Cited

U.S. PATENT DOCUMENTS 6,137,168 A * 10/2000 Kirkman ...................... 257/691
6,667,546 B1 * 12/2003 Huang et al. ................ 257/691
6,689,636 B1 * 2/2004 Liao et al. ................... 438/107
6,770,963 B1 * 8/2004 Wu ............................. 257/691
6,777,802 B1 * 8/2004 Mora et al. .................. 257/691
6,790,760 B1 * 9/2004 Cohn et al. .................. 438/613
6,812,580 B1 * 11/2004 Wenzel et al. .............. 257/784
6,819,565 B1 * 11/2004 Kao et al. .................... 361/704

* cited by examiner

*Primary Examiner*—S. V. Clark
(74) *Attorney, Agent, or Firm*—Bruce Garlick; Garlick, Harrison & Mark

(57) ABSTRACT

A scalable multi-power integrated circuit package for integrated circuits having spaced apart first, second and third pluralities of respective spaced apart chip power bonding pads connected to-corresponding first, second, and third chip power supply nets, the chip power bonding pads disposed adjacent to a chip periphery defining the chip area, the scalable multi-power integrated circuit package comprising: a central chip mounting area for mounting one of said integrated circuits, said chip mounting area defining a chip mounting area periphery surrounding said chip mounting area; spaced apart first, second and third package power supply continuous conductive traces, each trace disposed adjacent to the chip area mounting periphery; corresponding first, second and third pluralities of spaced apart package bonding areas defined along each respective one of said first, second and third package power supply continuous conductive traces, each respective one of said package bonding areas disposed in bondable alignment with a corresponding one of said chip power bonding pads along said chip periphery such that a permanent conductive bond can be made between said package bonding area and said chip bonding pad. Alternatives include a chip scale package outline, in which one of the chip power supply nets is a common ground return for the other two power supply nets.

20 Claims, 11 Drawing Sheets

MULTI-POWER RING CHIP SCALE PACKAGE FOR SYSTEM LEVEL INTEGRATION

CROSS REFERENCE TO RELATED APPLICATION

The present application is a continuation of 09/754,900, filed Jan. 4, 2001, copending, and now issued as 6,770,963, which is incorporated herein by reference in its entirety.

TECHNICAL FIELD OF THE INVENTION

The present invention relates in general to the field of integrated circuit packages with multiple power supplies and more specifically to enabling greatly improved chip power bonding flexibility in systems integrating multiple complex functions to produce high functional density in compact electronic systems having high operational performance levels.

BACKGROUND OF THE INVENTION

An example of conventional integrated circuits and packages used in a conventional system with multiple power supplies (multi-power product) is an ordinary PC. Recent developments in highly compact, portable electronics may incorporate ICs in packages that have multiple functions requiring two or more different power supply leads or contacts for connection to electrically isolated or independent system power supplies. Industry today uses a mixed set of nomenclature designating IC packages with multiple and/or independent power supplies. Some of these are "multi-power level", "multi-voltage level". For the purposes of this discussion the term "multi-power chip' is used to designate a single IC chip/package having multiple functions that require multiple independent and/or electrically isolated power supply voltages (two or more, not counting ground return). These multiple voltages are provided by package electrical connections, i.e. power supply leads (conductive pads, pins or wires for mounting on a printed circuit board or substrate) for supplying different power supply voltages to internal functions separated or electrically isolated from each other.

Conventional IC packages preferred for such compact, portable electronic systems include those known as mini-BGA, micro-BGA, Flex-BGA, flip-chip-BGA, Film BGA, BCC, TFBGA and the like. Known examples are described by Schueller et al in U.S. Pat. No. 5,990,545, "Chip Scale Ball Grid Array for Integrated Circuit Package" the '545 patent), by Eng et al in U.S. Pat. No. 5,952,611 "Flexible Pin Location Integrated Circuit Package" (the '611 patent), and by Igarashi et al in U.S. Pat. No. 5,990,546 "Chip Scale Package Type of Semiconductor Device" (the '546 patent), all incorporated herein by reference. The packages detailed in these patents described some of the known structural features for connecting external system power supply lines to the package external leads, and different organization, structure and formation of internal package insulating layers and conductive routing elements to provide a desirable arrangement of numerous isolated conductor paths to internal package bonding lands for subsequent convenient connection to selected chip bonding pads.

For example the '546 patent shows chip electrode 11 (i.e. a chip bonding pad) coupled to an outer electrode 22 of the package through contact with a metallic bump 211 forming the inner end of inner electrode 21. The inner electrode 21 is one end of a metal routing conductor 23 extending between insulating layers 24 and 25 and electrically connects outer electrode 22 to inner package electrode 21.

Many techniques for forming arrangements of insulated routing conductors between inner package electrodes and outer package electrodes are known and are not part of the present invention. However, previously, conventional integrated circuit packages for systems attempting to integrate several or many disparate functions into a few packages or a single package present a number of chronic difficulties for the electronics industry. These difficulties are exaggerated especially in the area of attempting to integrate what previously have been separate functions into unitary or single modules. E.g. mobile phones containing one or more other functions: fax, messaging, microcomputer, personal digital assistants (PDAs) and the like.

To produce a single-chip system with multiple, disparate functions, such as a mobile phone combined for example with some computational capability, it may be necessary to combine RF power, analog processing, semiconductor RAM/ROM and CPU functions and perhaps flash memory. Each of these functions may work optimally at different power supply voltage levels, e.g., perhaps 10 volts for flash memory, 5 volts for the phone's RF transmitter and 3 volts for the RAM/ROM and 1.9 volts or less for the CPU.

Real world examples of these in particular include: single package memory subsystems with 3.3 v and 5 v power supply leads. Another single package solution is an entire PC having power supply voltages of 1.8 v (CPU), 3 v (memory), 5 v (logic) and 10 v (embedded flash memory).

The problems known in packaging multi-functional, multi-power level systems include power, ground, and I/O package pin count proliferation, the many-to-one relationship between chip power pads and multiple system power bus circuits (power bus nets), difficulty in reconciling chip bonding pad and package bonding area layouts with functional architecture, bonding ease, manufacturing throughput and cost, system board layout constraints, operating performance levels, signal transition speeds, lead inductance, I/O driver noise (ground bounce), signal cross-coupling, signal isolation, and others.

Power efficiency is a phrase sometimes used to indicate the degree to which the power requirements for the chip or die inside the package, are met by the available package pins (either the number of package pins or package lead count) or the topological placement of the internal package electrodes used as package electrode bonding areas (lands) relative to the chip bonding locations (pads). A typical example of some of these difficulties in the case of a multi-power IC chip with three different functions each requiring an independent power supply that is to be connected to a PC board system having 3 electrically isolated power supplies V1, V2 and V3 are shown with regard to FIG. 7.

In FIG. 7, there is shown an example of preliminary bonding diagram 700 for multi-power IC chip 702 mounted in a prior art BGA package indicated by the arrow 700. The BGA package 700 has 256 bonding lands arranged as 2 opposed rows and 2 opposed columns along the periphery of the package 700 and indicated by arrows 706. 64 package bonding lands are arranged on each side of the package 700 and disposed to receive one end of a respective wire bond 744 connected at its other end to a respective chip bonding pad disposed on an adjacent chip edge.

The multi-power chip 702 has three separated or isolated power supply networks (nets) 710, 720 and 730. Four linear arrays of spaced apart chip bonding pads are arranged, one along each respective side of the nearly square chip 702 and indicated by arrows 740 pointing to two opposed rows and two opposed columns of chip bonding pad.

The chip 702 layout also includes chip signal traces (with associated bonding pads, not shown) connecting to a majority of the chip bonding pads 740. The chip bonding pads may comprise two major groups: chip signal bonding pads, e.g. pads 746, and chip power bonding pads (CPpads). CPpads for the chip 702 are pads 711–715, 721–724, and 731–734.

Each of the power nets 710, 720 and 730 are connected to several particular chip power bonding pads selected from chip pads among the rows and columns 740 along each side of the chip 702. Specifically, power net 710 is connected to particular chip power bonding pads 711, 712, 713 and 715. Power net 720 is connected to particular chip power bonding pads 721, 722, 723 and 724. Power net 730 is connected to particular chip power bonding pads 731, 732, 733 and 734.

In this example, which is not atypical, the BGA package 700 was selected for a trial bonding diagram for mounting chip 702 because of size constraints imposed by the system for which the multi-power functions provided by chip 702 are intended. The board foot print for the 256 pin BGA package 700 is defined by package length 750 and package width 752.

Although the package 700 meets the footprint requirement for the system, and can accept the chip 702 having chip length 756 and width 758 being mounted within, it can be seen that some of the chip power bonding pads are not connected to any one of the package bonding lands i.e. chip power pads 712, 722, 734 between package bonding lands 193–256, chip power pads 713, 714, 732 along package bond lands 129–192 and chip power pads 715, 721, 733 between package bonding lands 64 and 65.

Generally, it is preferred that the multiple chip power bonding pads for each chip power net be distributed roughly equally around the chip periphery 742 to provide similar low resistance paths to the associated system power supplies and system ground or grounds (e.g., V1, V2 and V3) for circuit functions distributed around the chip 702 as shown. The majority of connections (in this case wire bonds 744) between chip 702 and the package 700 are system signals (e.g. I/O) between respective chip signal bonding pads, and package signal bonding lands e.g., chip pad 746 and package signal bonding land 748. In order for the chip 702 to be fully functional, each and every chip signal must be connected to a package signal bonding land.

Therefore, after all the chip signal bonding pads 740 are connected to a respective one of the package bonding lands 706, there are no available package bonding lands to connect to the remaining chip bonding pads 715, 721, 733, 714, 732, 713, 712, 722 and 734. This is precisely the dilemma often presented to designers of compact, high-density systems utilizing multi-power IC chips. In order to provide complete functionality, some chip pads must be left unconnected, or a package having more package bonding lands, a consequently a much larger footprint must be used. Frequently system size constraints would prohibit using larger packages. This can force one to make one of several extremely undesirable decisions: abandon the product, redesign the system architecture and use different and perhaps new functions, or redesign the chips to fit in the available package outlines.

One or more of the manufacturing, functional and operational performance requirements placed on chip-package combination in the multi-power system 700 typically result in a requirement for more than a single chip power bonding pad (Cppad) for each of the separate power nets 710, 712, 714 for connection to V1, V2 and V3 respectively.

The number and location of CPpad connections demanded or required by desired chip functionality or performance vary. The width, length and location of chip power traces are limited by the necessary on-chip circuitry and the available die area. Multiple chip power traces may be necessary to feed on or more ones of particular on-chip circuit function or functions widely separated on the chip layout to obviate potential voltage drop along a power bus trace connecting such widely separated functions. Alternatively, multiple chip power traces may be necessary to decouple power bus to signal line cross talk. Or additional chip power traces may be required for electrical shielding or isolation between adjacent analog and digital circuit functions. The number and location of on-chip signal traces (cstrace) and their associated chip signal bonding pads (CSpads) frequently compete with the number, availability and location of the Ppads relative to the desired number and locations of chip power pads.

The chip designer typically wants to optimize chip circuit function and performance while simultaneously minimizing chip area and package area (footprint). The chip designer will prefer to physically locate chip functions in the package in a way that maximizes the performance of the most desired system features, whether it be switching speed, operating frequency, noise immunity and the like. Therefore the designer will tend to fashion a chip plan focusing on those aspects. Once the chip functions and performance requirements are defined and located, chip circuitry power connections must be made between the chip functions and the required system power bus(es). Connection of the Chip power pads to PPads frequently are constrained by the number and locations of CSpads and the number and locations of available PPads. So an undesirable tradeoff must frequently be made between chip (and consequently, system) performance and the size and cost of the package in which the chip is mounted.

There are many instances of systems produced that are larger or more costly than otherwise desired because the package in which chips are mounted is selected only because there are enough package pins (and PPads) to accommodate all the chip signals and just enough to accommodate the number of chip power nets. If an smaller alternate package had been available, that could accommodate the number and location of all chip signal pads and all desired chip power pads, the system could have been smaller and/or less costly and perhaps provided higher performance.

This illustrates the need for a package having a package bonding pad(s) (or bonding location) PPad to be located and available, corresponding to where each and every desired chip power pad CPad is located for a given chip function layout. Additionally, the chip layout may be such that there are conflicts between the optimum location of one or more chip power pads relative to other power pads or signal pads, and the available PC board or substrate connection pattern. One well-known problem is the double-sided PC board pin 1 power/ground contention issue.

All chip signal pads (CSpads) must have corresponding package signal pads (pspads) in order to provide connection to respective external system signals. Because of the limited number of package bonding pads (ppads) available caused by limitations on pad size, spacing and package dimensions, caused by cost or system size limitations, some chip power pads may not have corresponding package power pads. This could result in limited or lowered operational performance, lower yield and higher cost.

Frequently a system redesign or feature addition will result in an additional signal being added to the chip. This means there must be a package bonding land available for bonding to the new signal pad being added to the chip layout. If the package is already pin limited, the package size may have to be increased just to add one additional pin. If the PC board layout were also size constrained, this would mean a complete system redesign; qualification and new manufacturing set up would be necessary just to release the new product feature. This is not an acceptable situation in most cases.

In the particular case shown in FIG. 7 if chip power pads for chip power bus 710 don t have corresponding package power pads to accept bond wires, they must be left unconnected in order to make the chip 702 functional at all. Therefore, power distribution from the system power bus on the PC board or substrate (not shown) intended to provide power for the chip power bus 710 and thence to the appropriate chip circuit functions (not shown) may not be sufficiently uniform to permit the chip 702 to meet operational or performance requirements. This can occur if the power drawn by circuit functions adjacent to the un-bonded cpads is large relative to the total current capacity of the chip power bus 710.

To maximize system performance the current carrying capability or capacity of the total power distribution path of each power bus must be optimized. The total power distribution path for the whole package-chip combination consists of the package pins, bonding wires, package bonding pads (ppads), chip bonding pads (cpads) and the on-chip power traces to all the on-chip circuit-to-power bus connections. In other words the total conductive path(s) between one end of the power bus at the package pin power bus connections to the PC board outside, and the innermost chip circuitry connections to the other end(s) that power bus distribution must be carefully considered.

Another aspect of a power efficiency limitation for the prior art is the current carrying capacity of bonding wires relative to the circuit traces. Circuit traces are very narrow and thus have limited current capacity. A single bonding wire of 1 mil can supply about 20 to 40 ma of current. A single circuit trace to carry that much current may have to be many mils wide. If the circuitry on the chip that needs that much current is not conveniently located relative to an available package power pad, much chip area is wasted just in metal width, unless additional package pins are dedicated to distribute that current to widely separated points on the chip. This wasted chip area-leads to higher cost and lower yields.

These issues are aggravated by the small packaging formats, e.g. chip scale packages such as mini-BGA, micro-BGA, Flex BGA, flip-chip BGA, film BGA, BCC, TFBGA and the like, desired in high integration systems and are further aggravated by the expanded set of functional and performance requirements imposed by the combination of functions seen in more complex systems.

Other issues exacerbating the dilemma are characteristics like: package size, package lead self-resistance, self-inductance, mutual-inductance, cross talk to other signal or power bus lines or traces, isolation between adjacent circuit functions having contiguous peripheral edges on the chip.

It is not only the amount of current being provided to a particular circuit function(s), it is the parasitic elements associated with that delivery because the size and number of chip circuit traces that are connected to chip power pads don't match the desired level: e.g. resistance, impedance, inductance, shielding, isolation, etc. as listed above.

These issues are particularly relevant to systems-on-a-chip like a mobile phone, desktop or notebook computer, because the more different types of functions there are being integrated into one package, the more likely there are different power level requirements. E.g., a memory function in one part of the chip, RF transmission in another part, etc.

SUMMARY OF THE INVENTION

The present invention is directed to apparatus and methods of operation that are further described in the following Brief Description of the Drawings. Detailed Description of the Drawings, and the Claims. Other features and advantages of the present invention will become apparent from the following detailed description of the invention made with reference to the accompanying drawings.

DETAILED DESCRIPTION OF THE INVENTION

Figure 1:
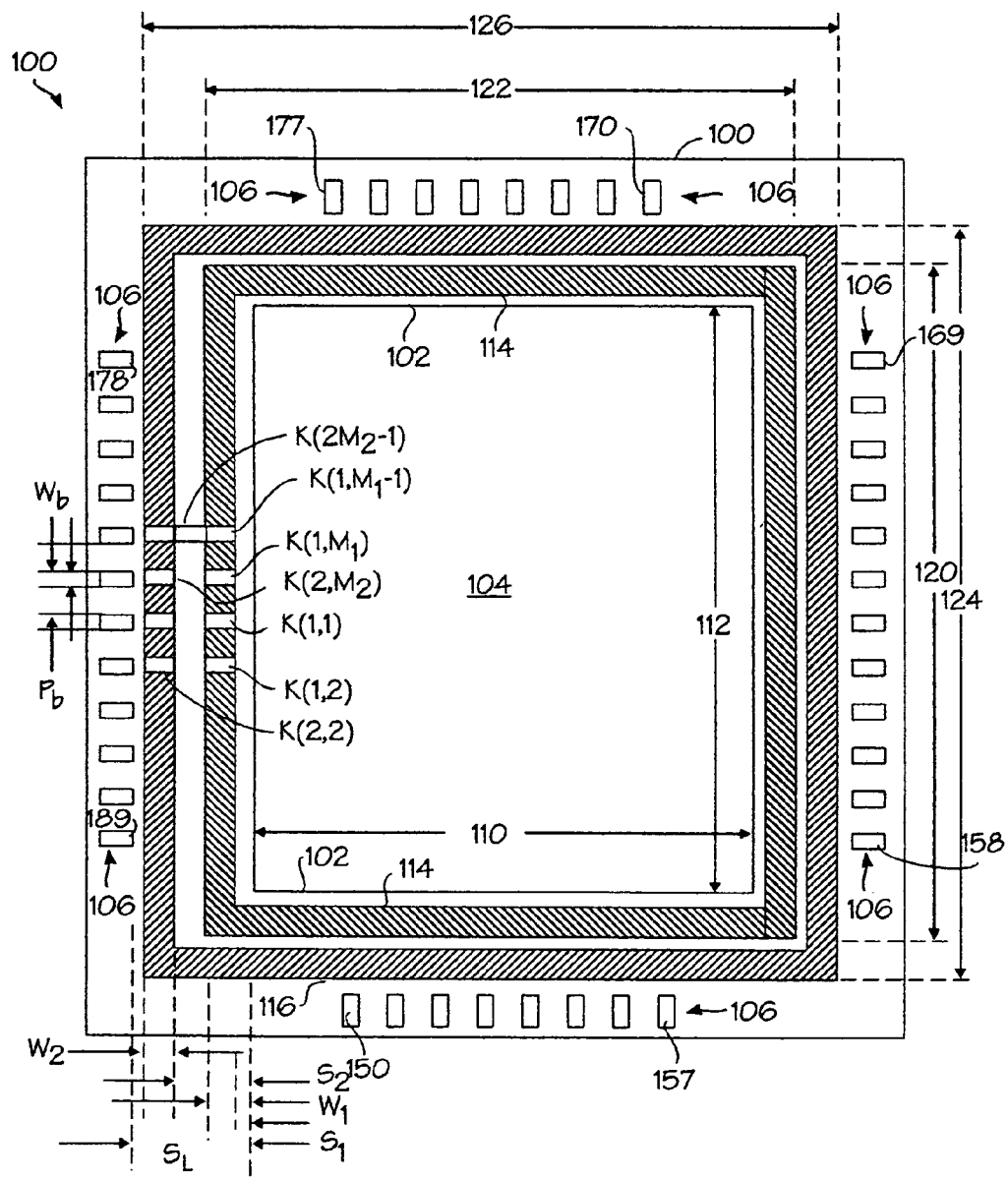
FIG. 1 shows a plan view of one embodiment of a multi-power ring IC package according to the present invention.

With reference to FIG. 1, there is shown a plan view of the interior of an embodiment 100 of the present multi-power ring IC package invention indicated by the arrow enumerated as 100. External package electrodes (e.g. package pins, bumps or solder balls) for routing from selected external PC board electrode patterns to internal package bonding electrodes are not shown. Such routing and external electrode lead formation and placement is known in the art and assumed to be present in permissible number, form and location appropriate for a particular size, external lead type and package aspect ratio of embodiments of the present invention. For example, the multi-power ring package 100 can be considered to be a Ball-Grid-Array (BGA) type package having an appropriate permissible number and location of solder balls such as those shown as balls 54 in FIG. 3 in the referenced U.S. Pat. No. '545 by Schueller.

One of the most significant issues for any IC package type and size is the maximum available number of external leads and the maximum number and location of internal bonding locations.

The multi-power ring package embodiment 100 includes a chip mounting surface periphery 102 defining within a planar chip mounting surface 104. A plurality of spaced apart package bonding lands are indicated by arrows 106 and are disposed parallel to the chip mounting surface 104 and are distributed circumferentially around the chip mounting periphery 102 and spaced distally therefrom.

Mounting surface 104 has a first rectangular edge dimension 110 and a $2^{nd}$, orthogonal edge dimension 112. A conductive first annular power-ring track 114 is defined in parallel planar and concentric relationship with the mounting surface 104 and the package bonding lands 106. The first ring 114 is disposed between and spaced apart from the periphery 102 and the bonding lands 106.

A $2^{nd}$ annular power-ring conductive track 116 is also defined in parallel planar and concentric relationship with the mounting surface 104 and the bonding lands 106. The $2^{nd}$ ring 116 circumferentially surrounds the mounting surface 104 and the first conductive annular power-ring track 114. The $2^{nd}$ annular track is disposed between and spaced apart from the first ring 114 and the bonding lands 106.

Both rings 114, 116 circumferentially surround the mounting surface 104 and are spaced distally away from the chip mounting surface periphery 102 in the plane of the mounting surface 104 by respective spacing widths S1 and S2 directed normal to the periphery 102.

First power-ring 114 and second power-ring 116 are dedicated to provide a respective maximum number of potential receiving bonding sites for two independent chip power supply nets (not shown) disposed on a multi-power IC chip having dual independent power supply nets to be mounted in the multi-power package 100. It will be apparent to a person of ordinary skill in the art once having seen this teaching that the two annular power-rings 114 and 116 permit great flexibility in power bond pad layout for IC chips having two such independent power supply nets.

It will also be readily apparent that an additional spaced apart annular power-ring disposed circumferentially around the first two can provide equivalent flexibility for power bond pad layout for an additional independent power supply net disposed on such a multi-power IC chip mounted in such a multi-power package embodiment (not shown).

The package bonding lands 106 are spaced distally outside of the ring 116 at a spacing width SL directed normally from the periphery 102 in the plane of the surface 104. The outer bonding lands 106 may be connected to unique, electrically isolated package pins (not shown), providing bonding sites for conductors (e.g., wire bonds) connected to chip signal bonding pads e.g. I/O signals, power return bonding pads (e.g. ground) or other power supply bonding pads (e.g. bias voltage levels or the like) from an IC chip mounted in the package 100 (not shown).

The maximum available number of unique, electrically isolated package pins will be limited by the number of package bonding lands 106 that can be distributed around the periphery of the chip bonding area 104, plus the number of electrically isolated power rings of the present invention.

In the example of FIG. 1, the pads 106 are distributed in four groups e.g., of 8, 12, 8 and 12 along each edge of the package. For convenience the pads are numbered in succession: pads 150–157, 158–169, 170–177, 178–189. The number, NBL, of package bonding lands 106, may be limited by the size of the package and the available bonding technology, or by some other technical or cost constraint. For a multi-power chip having the sum of individual signal bonding pads and separate power net bonding pads that exceed NBL, a prior art package of that pin count would be unusable.

With the features provided by the multi-power ring package invention, such a chip can be mounted in a 40 pin package having lateral dimensions very nearly, or identically the same as the prior art packages with no additional manufacturing difficulties or technological improvements required.

Respective rings 114, 116 are dimensioned with outside orthogonal length (Hr1, Hr2) and width (Wr1, Wr2) dimensions 120, 122 and 124, 126 respectively. The dimensions 120, 122 and 124, 126 define the respective-annular rings 114, 116 to extend annularly along the chip mounting periphery 102 around the full circumference, Cm, of the mounting surface. Cm is effectively twice the sum of the mounting surface length dimension 112 plus the width dimension 110. Annular rings 114 and 116 extend annularly around the periphery 102 with respective effective maximum available annular bonding widths L1 and L2. The extended effective maximum available annular bonding widths L1 and L2 are equal to twice the sum of the respective ring length dimensions 120, 124 and width dimensions 122, 126; i.e. L1=2(Hr1+Wr1) and L2=(Hr2+Wr2).

For a given bonding technology characterized by an allowable annular ring bond width Wb and allowable annular ring bond pitch Pb, the extended effective maximum available annular bonding widths L1 and L2 for rings 114, 116 define a respective maximum number of available power net conductor bonding locations M(j). The index j=1, 2 corresponds respectively to inner ring 114 and outer ring 116.

For a conductive bonding track having an available lateral bonding track extent (available bonding width) W(j), M(j) is approximately equal to the available lateral bonding track extent, W(j), divided by the allowable bond pitch Pb. For the two annular power rings 114 and 116 the respective available lateral bonding track widths are the respective effective annular bonding widths L1 and L2. Thus the maximum available number of power net bonding locations on ring 114 and ring 116 are M(1) and M(2), where M(1)=the integral part of L1/Pb and M(2)=the integral part of L2/Pb.

Referring still with regard to FIG. 1, the respective number of available bonding locations M1 and M2 on the annular rings 114, 116 are shown as distributed in counter-clockwise sequential annular order as the respective sequential locations K(1,1), K(1,2),- - - K(1,M1) and K(2,1), K(2,2), - - - K(2, M2). This characterization is made to more easily point out how the multi-power ring package of the present invention eases bonding pad layout design in IC chips and packages and provides significant potential improvements on manufacturing, operational and functional performance for multi-power packaged chips and systems. For large pin count packages, M1 and M2 greatly exceed any practical number of chip power pads that need to be connected to package bonding lands and thus enormously increase the availability of chip power pad bonding sites over the prior art packages.

It will be apparent that the effectively unlimited number of available power net bonding locations (or bonding sites) M1, M2 provided by the multi-power ring structure of this invention significantly reduces the need to use very many (if any at all) of the individual package bonding lands 106 for connecting one, two or more independent power supplies to the power nets of an IC chip mounted within.

Figure 2:
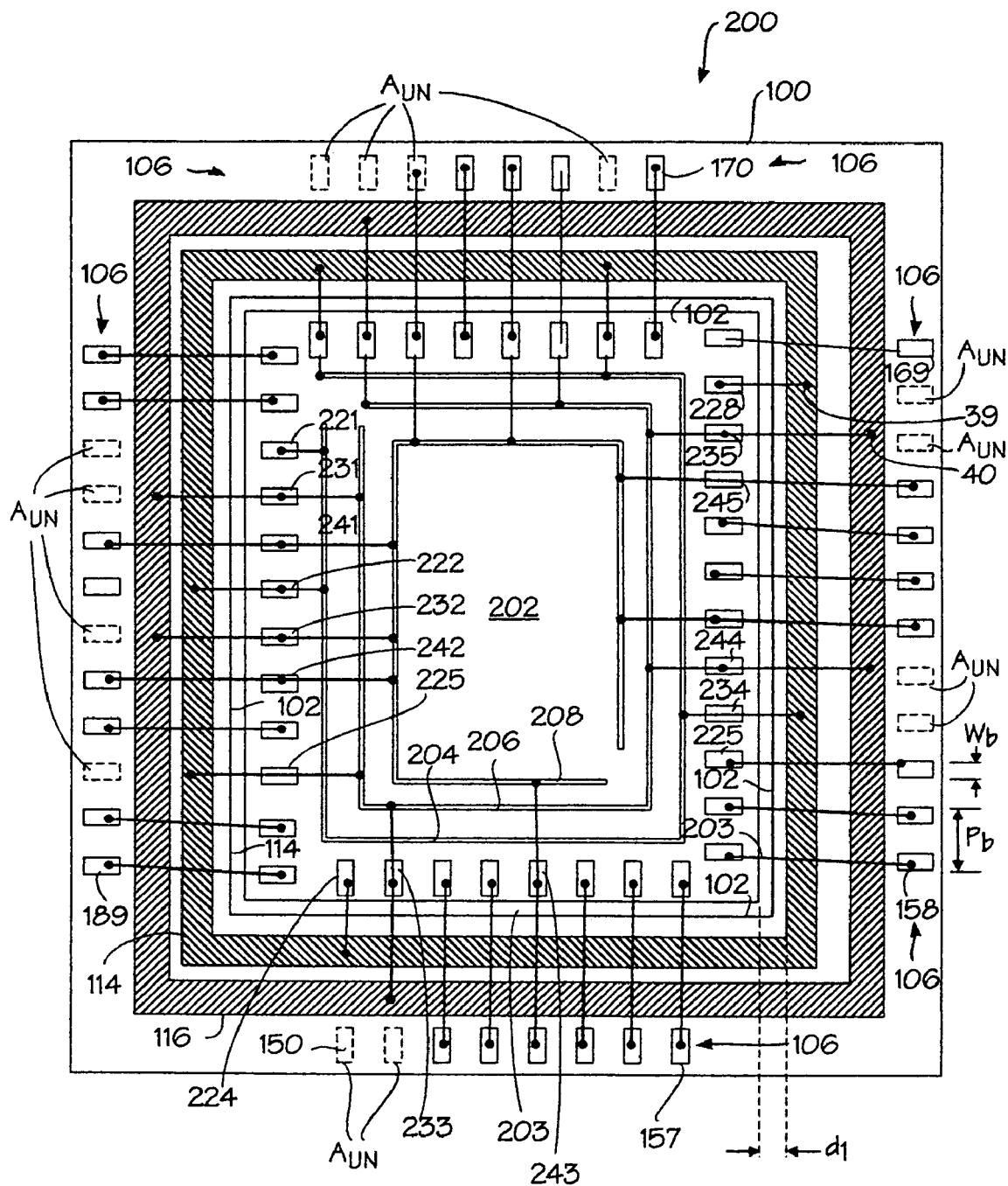
FIG. 2 illustrates the multi-power ring IC package of FIG. 1 having a multi-power ring IC chip mounted therein with respective chip power-net bonding pads connected to separate annular power-ring bonding rings.

Referring now to FIG. 2, the multi-power ring package 100 of FIG. 1 is shown with a selected multi-power IC chip 202 mounted to the chip mounting surface 104 within the chip mounting periphery 102 as a mounted, but not sealed assembly 200. The multi-power chip 202 is shown with first, second and third independent power supply nets 204, 206 and 208. Power nets 202, 204, and 206 have associated power net chip bonding pads 221–228, 231–237, and 241–247. Power net bonding chip pads 221–228, 231–237, and 241–247 are shown distributed in respective counter-clockwise annular order around chip periphery 203, within the chip-mounting periphery 102.

First power net pads 221–228 are connected to 8 sequentially ordered, annularly spaced apart ones of 57 sequentially ordered annularly spaced apart maximum available first power net bonding locations on the first annular power ring 114. (57 is chosen for illustrative purposes only and is not necessarily mathematically correct for the geometry in the example). Second power net pads 231–237 are connected to seven sequentially ordered annularly spaced apart ones of 65 sequentially ordered annularly spaced apart maximum available second power net bonding locations on the second annular power ring 116. (65 is chosen for illustrative purposes only and is not necessarily mathematically correct for the geometry in the example). The 7 third power net bonding pads 241–247 are shown connected to 7 of the outer bonding lands 106 in this example. An alternative embodiment of the present invention having a third spaced apart power ring disposed distally outside the second power ring 116 can easily be visualized as providing 7 equivalent sequentially ordered, annularly spaced apart bonding locations out of an equivalent maximum available number of ordered, spaced bonding locations on such a third power ring.

One of the major aspects of the present multi-power ring invention is the enormous bonding layout flexibility provided by the great number of combinations of sequentially ordered, annularly space apart available power net bonding locations. This can most easily be seen by calculating the number of combinations, nCm of N sequentially ordered, annularly spaced apart bonding locations that can be selected out of a maximum available number, M, of sequentially ordered, annularly spaced apart bonding locations.

For a closed annular track divided into m adjacent locations sequentially ordered from 1 to m around the full circumference of the annular track the number of combinations nCm of n different locations selected sequentially without repetition from the sequence remaining after each selection can be shown to be: nCm=(m)!/(m-n)!.

For a segment of an annular track that is not a complete circumference the number of combinations of such n selected locations is less, and can be shown to be nCm=(m-n)!/(mi2n)!. In either event for practical numbers of chip power net bonds on multi-power ring packages according to the present invention, the number of combinations is extraordinarily large.

The other advantage provided by the multi-power ring package invention is shown by the package bonding lands A. The power net wire bonds 221, 231, 222, 224, 225, 233, 234, 235, 226, 227, 236, 237, 228 are bonded to one of the power rings 114, 116 instead of the package bonding lands. This provides the opportunity to use a package with fewer bonding lands. Fewer bonding lands enables one to use a smaller package since the perimeter of the package can potentially be smaller. For a packaging technology where the Wb, Pb dimensions are such that they force the use of a larger package perimeter for the required number of chip bonding pads of a given chip size, omitting the un-needed package bonding lands, Aun, allows a smaller package to be used.

The advantages of such flexibility for multi-power net bonding layout choice are numerous, some of which have been alluded to above in discussing problems with conventional IC packages for multi-power IC chips.

Figure 3:
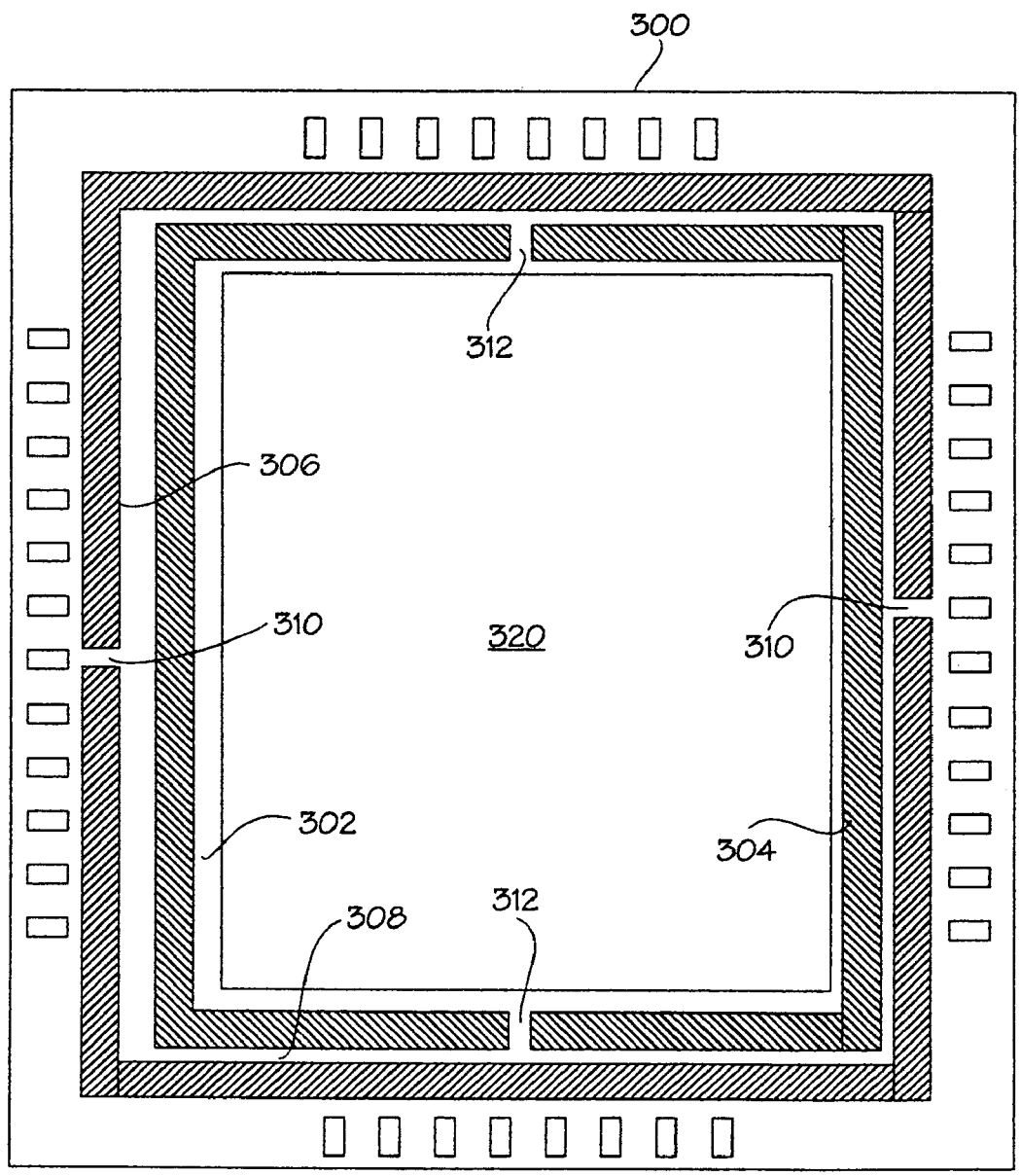
FIG. 3 illustrates an alternative multi-power ring IC package according to the present invention.
Figure 4:
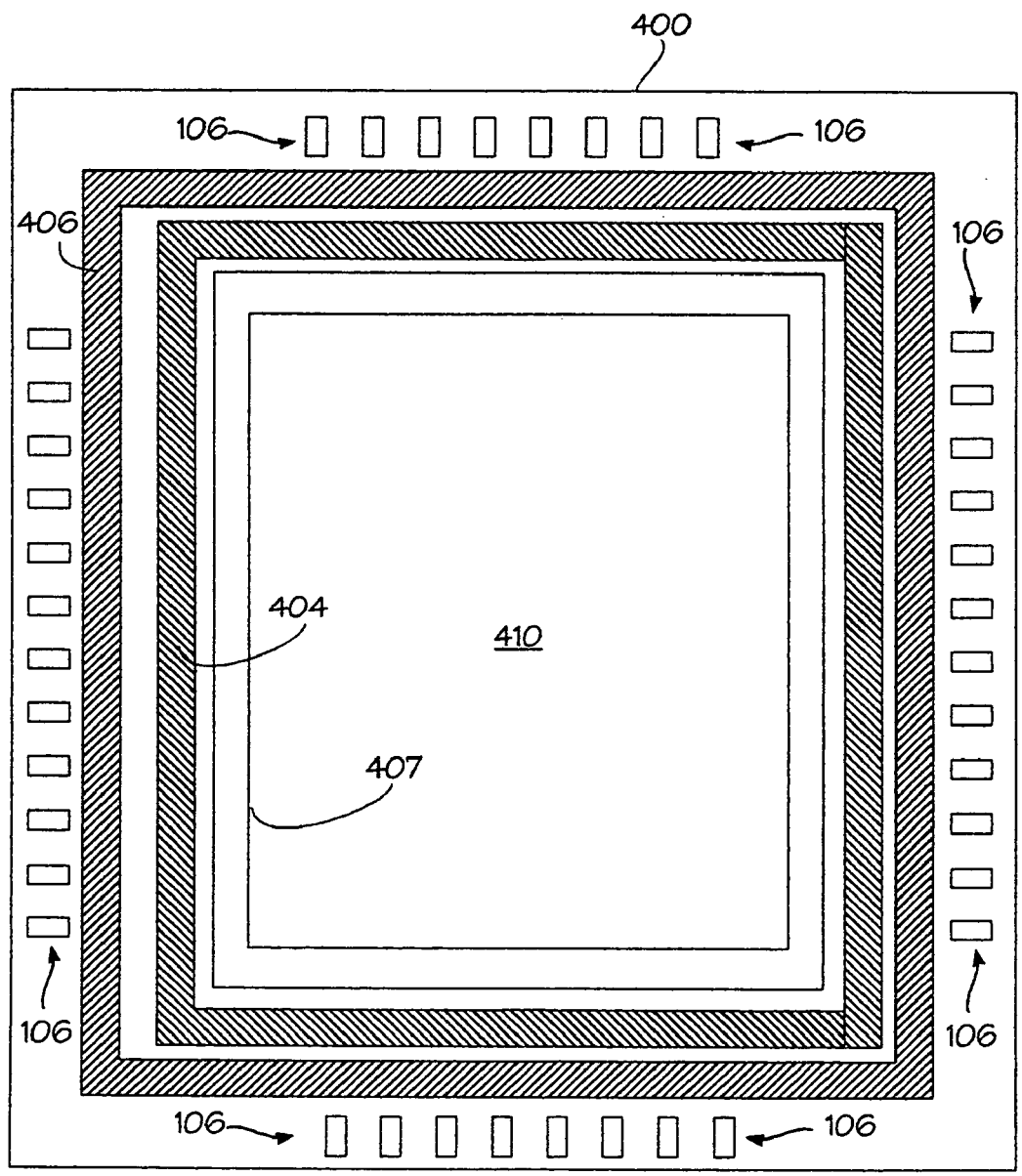
FIG. 4 illustrates an another alternative multi-power ring IC package according to the present invention.

Referring now to FIG. 3 and FIG. 4 there are shown alternative embodiments of multi-power ring IC packages according to the present invention. FIG. 3 is a segmented annular power ring embodiment 300 of the present invention showing four annular power ring segments 302, 304, 306 and 308. Segments 302 and 304 are respective opposed C-shaped segments formed by separating the complete annular power ring 114 of FIG. 2 into the two electrically isolated pieces 302 and 304 defining insulating voids 312. Segments 306 and 308 are opposed C-shaped segments formed by separating the complete annular power ring 116 of FIG. 1 into the two electrically isolated pieces 306 and 308 defining insulating voids 310.

The segments 302, 304, 306 and 308 of FIG. 3 would enable mounting and bonding a multi-power IC chip having 4 independent power supply nets, each net bonded separately by respective power-net bonding pads to a separate-one of the four isolated power ring segments. Four appropriate ones (or sets) of separate external package power leads would be provided and routed (not shown) to the respective electrically separated power-ring segments. The four isolated power-ring segments 302, 304, 306 and 308 provide flexible bonding for electrically connecting the respective independent external power sources to up to 4 respective independent chip power nets disposed on an IC chip mounted to mounting surface 320 of the package 300.

As before, great flexibility for creating numerous alternative-bonding layouts is provided by the numerous combinations of power-ring bonding locations, nCm for each of the isolated segments 302, 304, 306 and 308. Even though the total number of available power-ring bonding locations has been cut about in half by the division of the rings 114, 116 into segments 302, 304 and 306, 308, nCm/2 is still a very large number of possible bonding combinations.

Another alternative embodiment of the present invention is provided by the divided power ring segments 302, 304 and 306, 308. Two of the power ring segments may be used for separate ground return bonding locations for separate ground nets (i.e. non-shared ground, not shown) for two separate power nets disposed on a multi-power IC chip mounted in the package 300. Such separate ground returns can be useful in applications needing high isolation between noisy digital or RF functions, and highly sensitive analog functions, e.g. low noise, broad-band amplifiers and the like.

Referring now to FIG. 4, there is shown an alternative multi-power package 400 according to the present invention. Package 400 has three concentric, electrically independent, spaced apart annular power rings, 402, 404, and 406. Each power ring 402, 404, and 406 is a complete, bondable, annular power ring surrounding a central chip mounting surface 410.

The multi-power annular rings 402, 404, 406 are concentrically disposed between chip mounting area 410 and respective oppositely disposed outer rows and columns 106 of individual package bonding lands for connecting to chip signal bonding pads (not shown). The Multi-power ring package 400 is suitable for a multi-power IC chip having two independent power supply nets and one shared ground net (not shown). Two of the rings 402, 404 and 406 provide the respective nCm combinations of possible receiving bonding locations for power-net bonding pads of two of the IC chip power nets (not shown). The remaining ring similarly provides a like large number of possible bonding combinations for the respective bonding pads of the shared ground power net of the multi-power IC chip mounted therein (not shown).

As before, external package electrodes and routing conductors (not shown) are provided for the multi-power ring IC package 400 for separately connecting the power rings 402, 404, and 406 to respective separate external power supply and ground connections.

The multi-power ring structures shown in FIGS. 3 and 4 provide the same benefits of reduced package size for a given chip size and pin count (for pin limited chips) as described with regard to FIG. 2. Alternatively, the multi-power ring structures shown in FIGS. 3 and 4 provide for mounting a multi-power chip having a greater number of chip signal and chip power pad bonds within a package of a given size having a limited number of individual bonding lands along the package periphery.

Figure 5:
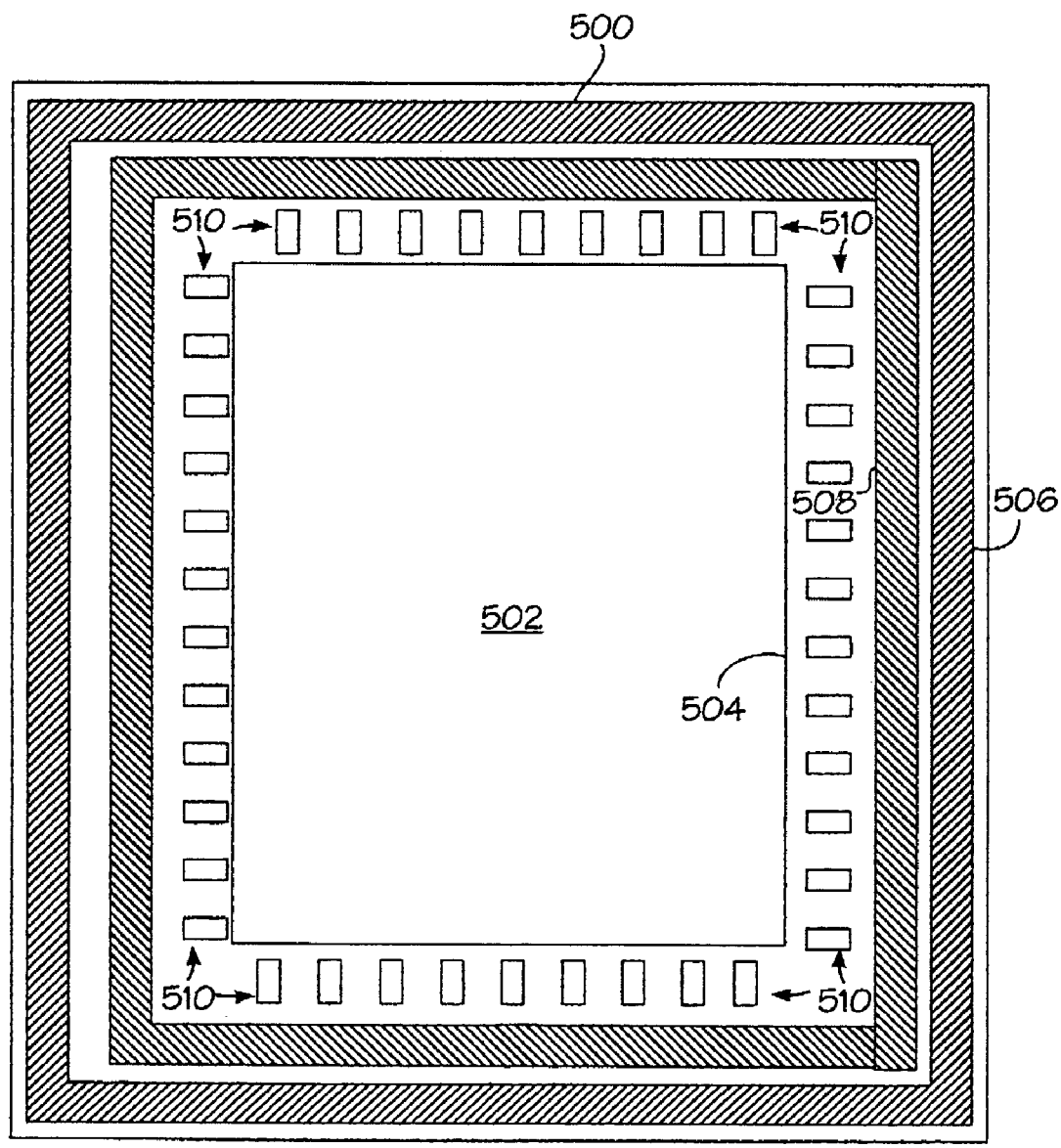
FIG. 5 illustrates yet another alternative multi-power ring IC package according to the present invention having individual package bonding lands placed inside the power rings.
Figure 6:
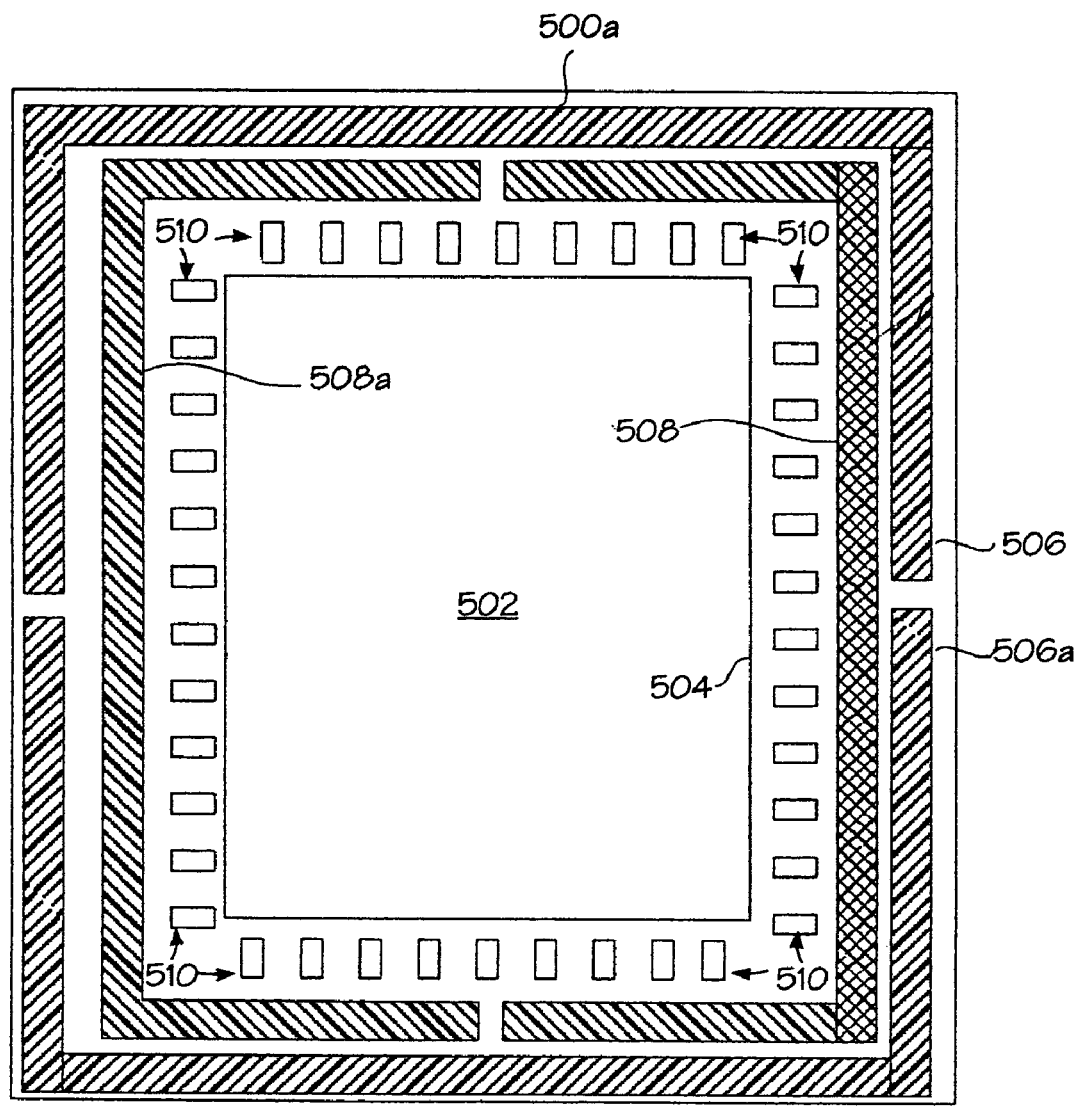
FIG. 6 illustrates a alternative segmented multi-power ring IC package having individual package bonding lands disposed inside the multi-power ring segments.

Referring now to FIG. 5 and FIG. 6, there are shown alternative embodiments of the present multi-power ring IC package, in which rows and columns of package bonding lands indicated by arrows 510 are disposed inside of concentric multi-power rings 506, 508 (or segments 508, 508a and 506, 506a), between the rings (or segments) and chip mounting area 502.

The multi-power ring structures shown in FIGS. 5 and 6 provide the same benefits of reduced package size for a given chip size and pin count (for pin limited chips) as described with regard to FIG. 2. Alternatively, the multi-power ring structures shown in FIGS. 5 and 6 provide for mounting a multi-power chip having a greater number of chip signal and chip power pad bonds within a package of a given size having a limited number of individual bonding lands along the package periphery.

It is readily apparent that the improvement in bonding flexibility for power and ground nets of multi-power IC chips is provided at a relatively small sacrifice of chip mounting area within the package outline of a chip scale IC package.

Figure 7:
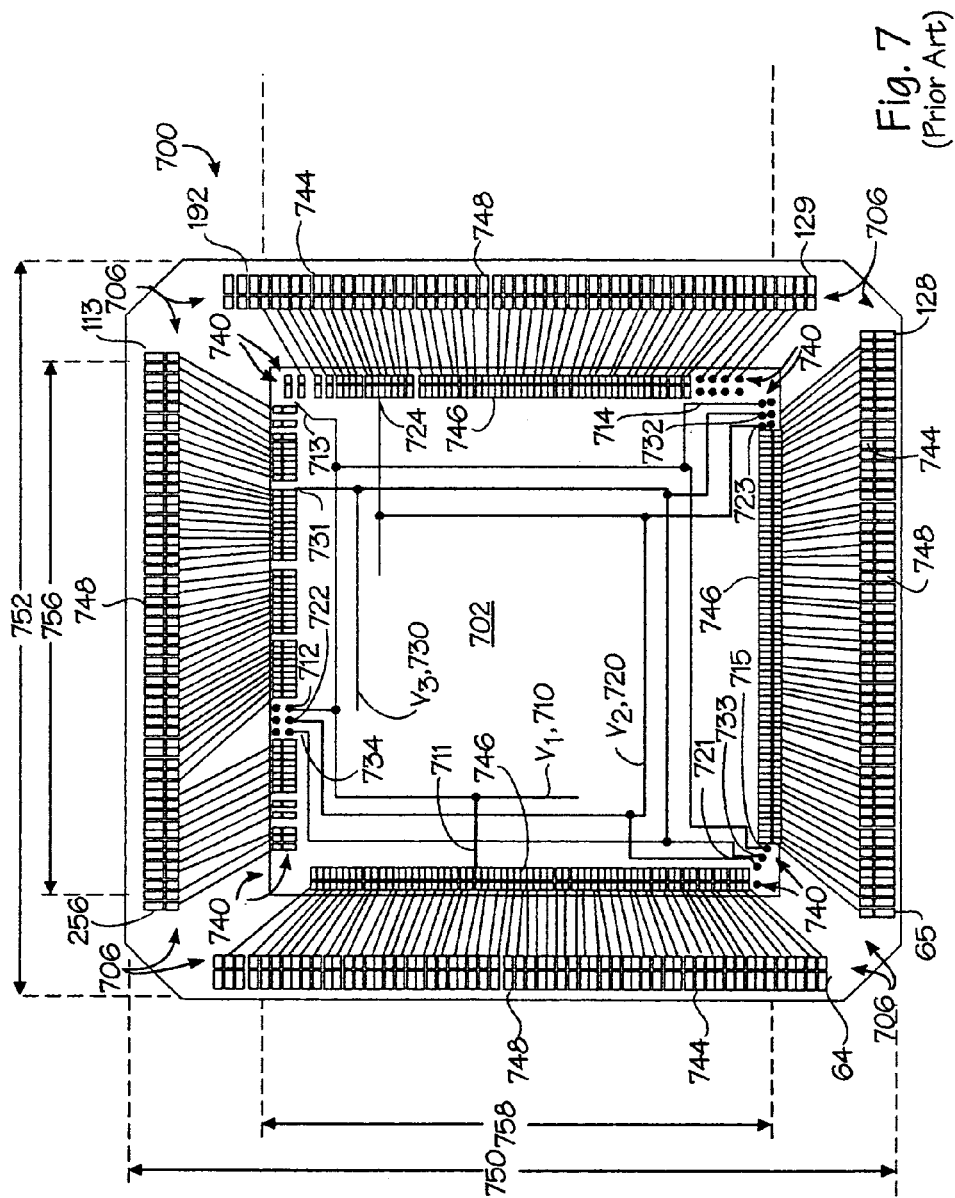
FIG. 7 illustrates an example of a prior art BGA package pin limited bond layout for a multi-power ring IC chip.
Figure 8:
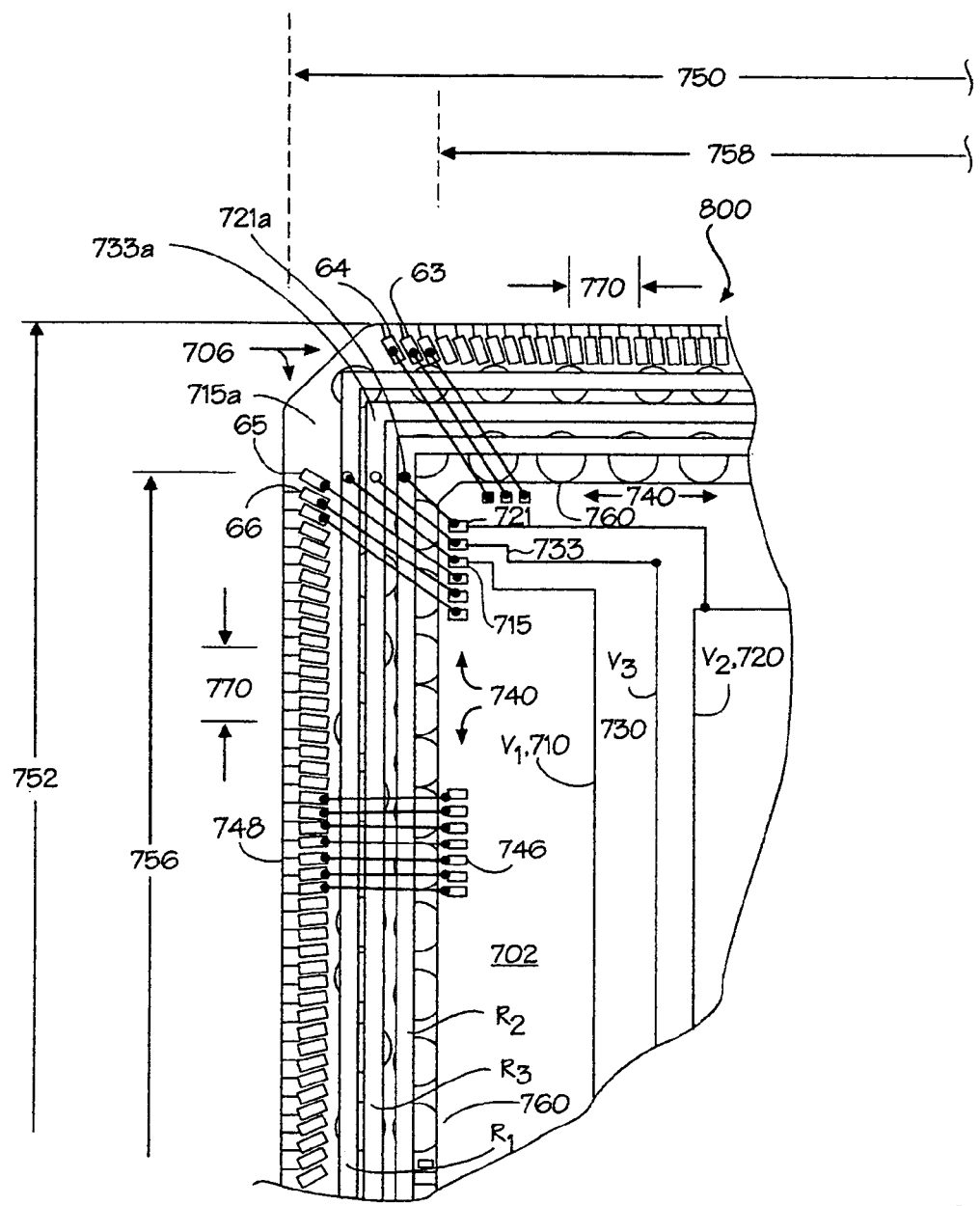
FIG. 8 illustrates an expanded detail portion of a multi-power ring BGA package having the same footprint as the prior art package of FIG. 7 and bonded to the multi-power ring IC chip of FIG. 7.

With regard to FIG. 8, there is shown an expanded detail of a multi-power ring package 800 in which the multi-power chip 702 of FIG. 7 is mounted and bonded. Package 800 has the same length and width dimension 750, 752 as prior art package 700 and provides sufficient mounting area to accept the chip 702 having length and width 756, 758 as before. However, in addition to the rows and columns 106 of 256 package bonding lands disposed on the package periphery, multi-power package 800 has three spaced apart annular power rings R1, R2, and R3 disposed between the package bonding lands 106 and the chip periphery. Power rings R1, R2 and R3 are connected to the same appropriate package external leads (not shown) for connecting to the separate system power supplies V1, V2, V3 as was prior art BGA package 700.

The package 800 is depicted as partially transparent, other than the package bonding lands 706, chip 702, wire bonds 744 and multi-power rings R1, R2 and R3. This partially reveals backside conductive external solder ball patterns 760. Patterns 760 are disposed on orthogonal lateral and transverse pitch dimension 770. The pitch dimension 770 establishes the number of external leads available for a given package size and sets the package length and width footprint indicated by arrows 752, 750.

Multi-power rings R1–R3 of the present invention are routed to be connected to the same respective external package power leads as were the equivalent package power bonding lands in the prior art package of FIG. 7 (not shown). This permits the package 800 to be used in the system without the performance or functional penalty imposed by the prior art BGA of FIG. 7. The chip power nets V1, V2, V3 can now be freely bonded to the associated power rings in one of the numerous alternative combinations as described above. FIG. 8 shows the one corner of the chip between package leads 64 and 65 having the chip power pads 715, 721 and 733. Whereas in the prior art BGA package of FIG. 7 these power pads were unbonded and made the chip 702 unusable in the system application, in the multi-power ring BGA package of FIG. 8, all the previously unbonded chip power pads can take advantage of the numerous combinations of available chip power pad bonding sites permitted by the multi-power rings R1, R2, and R3 and be bonded thereby, e.g., to the respective power ring bonding sites, 715a, 733a, and 721a.

Figure 9A:
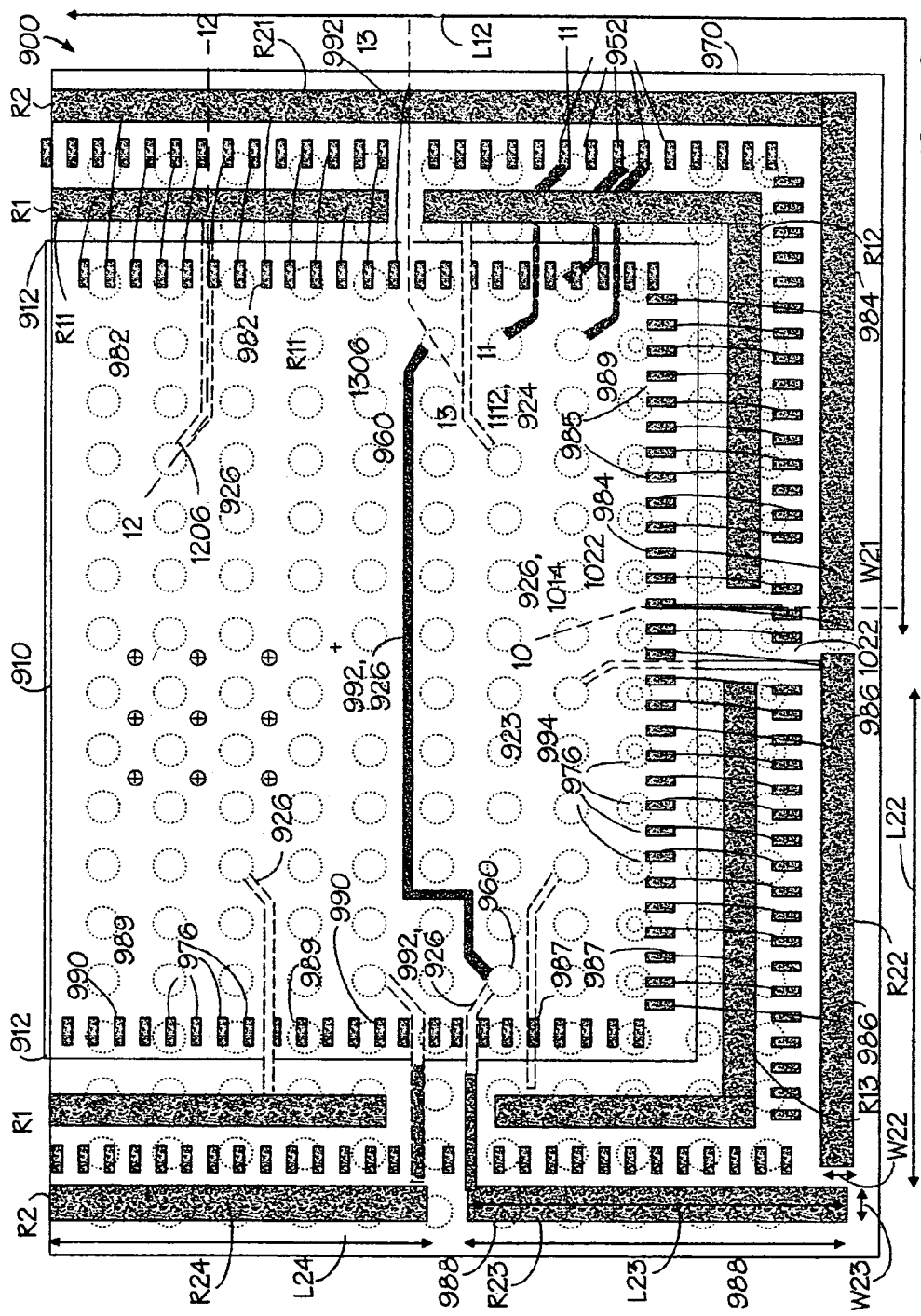
FIG. 9*a* is a plan view of a portion of a two-layer metal embodiment of the present multi-power ring chip scale package invention.
Figure 9B:
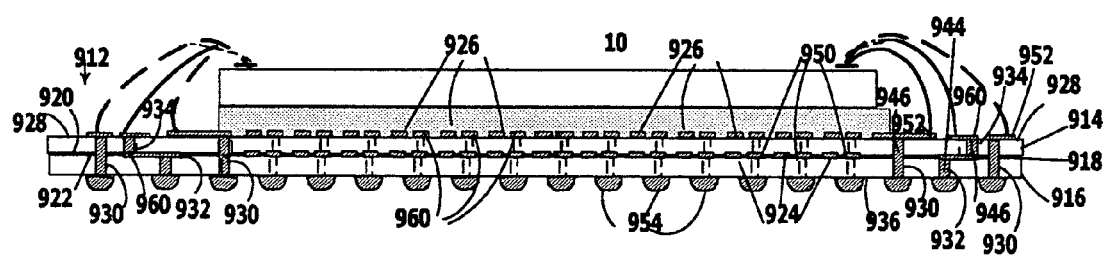
FIG. 9*b* is an elevation view of a cross section of the package of FIG. 9*a*.

Another aspect of the present chip scale multi-power ring package invention is shown with regard to the FIG. 9A and FIG. 9B. With regard to FIG. 9a a major portion of three sides of a dual metal layer interconnect chip scale package embodiment of the present invention is indicated by the arrow 900. The features of interest are shown in the plan view of FIG. 9a and the elevation view of FIG. 9b. The chip scale package 900 receives an IC chip 910 having a chip periphery 912, mounted thereon. The package 900 includes two electrically insulating layers 914, 916. Layers 914, 916 have facing surfaces 920, 922 and opposing surfaces 928, 936. The facing surfaces 920, 922 are joined at an interface 918. At the interface 918 there is defined an intermediate patterned conductive layer 924. Intermediate layer 924 may be patterned from a metal foil sandwiched in a three-layer flexible tape or from a conductive layer deposited on one of the insulating layers 914, 916 prior to joining. Another conductive interconnect pattern 926 is defined on the opposite (top or die mount) side 928 of the first substrate layer 914. A ball grid array of spaced apart solder ball contacts (rows and columns of bumps 954) is defined on the outside (package mount to PC board) surface 936. Dotted circles 954 are shown to indicate the possible positions of the external solder ball contact array. Smaller dotted circles are shown to indicate the possible positions of the internal vias connecting selected top layer and intermediate layer metal patterns to selected ball locations.

The top side conductive pattern 926 defines a first multi-power ring group, R1, a second multi-power ring group, R2, and an annular plurality of package bonding pads 952 disposed between the rings R1 and R2. R1 is an annular group of spaced apart inside ring segments: namely segment R11, segment R12, segment R13, - - - concentric with and disposed proximal to the edge of the chip 912. The package bonding pads 952 are spaced apart along an annulus adjacent to R1. R2 is a concentric distal group of spaced apart ring segments (segment R21, segment R22, segment R23, - - - ) extending adjacent to and along the bonding pads 952.

The set of annular package bonding pads 952 is defined from the same metal interconnect layer 926 as the inner ring segment group R1 and the outer ring segment group R2. Inner and outer Ring segments designated by counting indices (R1$j$, R2$k$) of the R1 group and the R2 groups are defined by respective annular segment lengths (L1$j$, L2$k$) and orthogonal widths (W1$j$, W2$k$). The segments (R1$j$, R2$k$) are spaced orthogonal from peripheral edges defined by nearest adjacent chip, package or isolated interconnect routing traces by corresponding proximal (inward directed) and distal (outward directed) spacing distances (Wpj, Wpk, Wdj, Wdk), where (p) indicates a proximal spacing, (d) indicates a distal spacing distance, and (j, k) are the counting integers designating the jth segment of inner R1 set and the kth segment of the outer R2 set.

Three sets of electrically conducting feed-throughs (vias) 930, 932, 934 are defined within the substrate assembly layers 914, 916. The first set of vias 930 provide electrical connection from selected bumps 954 through both layers 914, 916 to selected top layer via pads 960 patterned in the conductive layer 926 at the opposite (top) side 928 of layer 914. The second set of vias 932 (second layer vias) provide electrical connection from respective selected bumps 954 to corresponding intermediate via pads 950 defined in the conductive pattern 924 at the intermediate interface 918. The third set of vias 934 (first layer vias) provide electrical connection from the selected via pads 950 at intermediate interface 918 to selected top layer via pads 960 defined in the top layer conductive pattern 926.

All of the vias are filled with respective metal connections 942, 944, 946 to provide electrical connection between respective vas pads 950, 960 and bumps 954.

Alternatively, additional micro vias (indicated by circled+ sign) may be provided in the first insulator layer 914 for additional coupling between routing traces patterned in the top layer interconnect 926 and the intermediate layer interconnect 924. The micro vias are located off the grid of the ball grid array bumps 954 so that interconnect between layers 924, 926 may be routed in the event all the vias 930, 932 located on the ball grid are used for connecting package pads 952 to package bumps 954.

The top interconnect pads 960 are defined to selectively couple with respective traces patterned in top conductor layer 926. The intermediate interconnect pattern 924 is defined to couple selective respective ones of the intermediate interconnect pads 950 between respective ones of second layer vias 932 and first layer vias 934. Package bonding pads 952 are defined on the tope surface 928 from the top layer interconnect pattern 926.

The three sets of vias cooperate with respective conductive patterns 924, 926 to provide selected electrical connection from selected chip pads to the appropriate circuit board connection pads defined on the printed circuit board (not shown) to which the chip scale multi-power ring integrated circuit 900 is mounted.

The package bonding pads 952 are laterally spaced apart along a concentric ring adjacent to the periphery of package edge 970 and spaced proximally inward therefrom. Connection is made by respective ones of the intermediate interconnect layer traces and respective metallic feed through traces. The respective metallic feed through traces connect through respective apertures from the intermediate interface to the inside facing surface of the first substrate where they electrically join to respective package bonding pads defined in the inside metal interconnect pattern A die mount insulating layer 972 is provided to cover the inside surface 928 of the first substrate 914 and the inside facing interconnect 926 so that electrical insulation may be insured between the chip mounting surface 974 and the aforementioned pads and substrate. The IC chip defines a plurality of chip bonding pads 976 disposed on the inside-facing surface 978 of the chip, generally concentric around and spaced proximally interior from the periphery 912 of the chip 910.

The three sets of vias, and the corresponding metal connections there in, combined with package bonding pads and the two sets of ring segments R1, R2 provides a flexible means of Interconnecting any desired chip bonding pad to any desired package pin.

Flexibility is provided for easing the burden of distributing multiple power supply voltages and multiple ground paths for decoupling noise-producing circuits from noise sensitive circuits by the segmented rings of the annular R1 group and the annular R2 group. For example segment R21 of ring R2 could be a first ground (or power) connection for chip bonds 982 on one side of the chip, and can provide the same low resistance path for ground connection to chip bonds 984 on the adjacent side of the chip.

In a like manner, segment R11 of ring R1 could be a power (or separate ground) for the chip wire bonds 983. The ring segment R11 is electrically coupled to a package bump 954 by routing through an intermediate layer 924 conducting trace (see FIG. 12)

Figure 13:
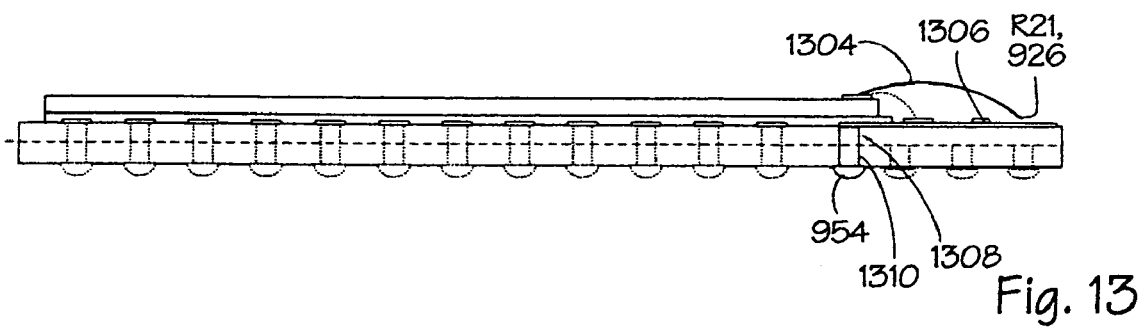

Ring segment R21 is coupled to a package bonding bump by routing through a top layer conductive trace 926 (see FIG. 13)

Outer ring group R2 ring segment R22 could easily be assigned as a ground path for chip bonds 985, and inner ring group R1 segment R13 assigned as a different power supply for the circuitry coupled by chip bonds 985. Again, the role of the ring groups can be switched from power to ground as shown by inner ring group R1 segment R13 assigned as a separate ground for chip bonds 987, where outer ring group R2 segment R22 takes on the role of another, separate power supply for chip bonds 986. Finally, outer ring group R2 segment R23 acts as a power bus for chip bonds 989, outer ring group R2 segment F24 as power for chip bonds 989 and inner ring group R1 segment R14 as ground for chip bonds 990.

The two interconnect layers 924, and 926 are also used to advantage with the segmented multi-power rings. This is shown by the coupling of rings segments R21 and R23 by the routing trace 990 formed in the intermediate layer interconnect pattern 924 and coupled through selected top layer vias 960 to short segments of top layer conductor patterns 992 and 1306 formed in top layer 926.

As is well known, package bonding bumps can optionally be omitted (depopulated) at selected sites in the ball grid array if contact to the PC board is not desired at such a site.

In either event, two or more segments of the same or different ring groups on opposite sides of the chip (or alternatively, on adjacent sides) can be grouped into a single power (or ground) supply net from one external package bump (or a number of paralleled package bumps). Grouping of multiple segments into one (or more) power or ground sub sets can be done by interconnection through either or both the two conductive layers 924, 926. In the case of the top layer 926, a gap between two segments of the inner ring group may be required to route a patterned trace from one outer ring segment to another non-adjacent segment. This flexibility is seen with regard to the four elevation views FIG. 10, FIG. 11, FIG. 12, and FIG. 13.

Figure 10:
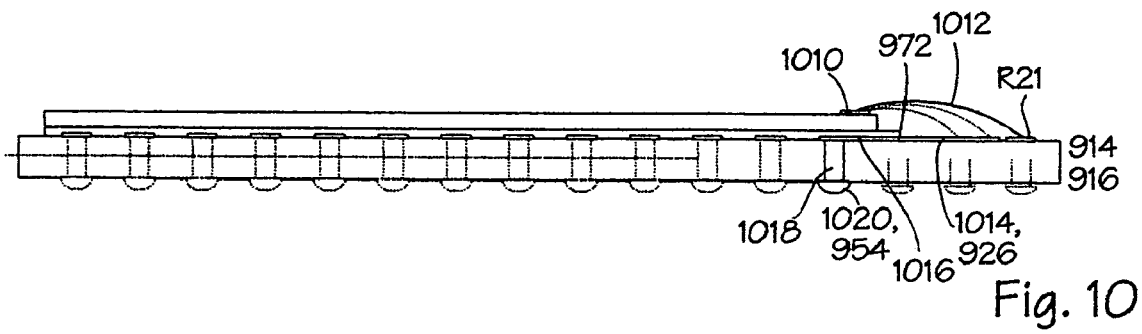
FIGS. 10–13 are elevation cross-sections of different interconnect options provided by the embodiment of FIG. 9*a*.

With regard to FIG. 10, there is illustrated the connection from a chip bonding pad 1010 to a package mounting bump inside the periphery of the chip by routing through an outer ring segment. FIG. 10 is a cross section along the line 10—10 of FIG. 9*a*. An outer ring segment R21 receives a bonding wire 1012 connecting from chip bonding pad 1010. The outer ring segment R21 is coupled to one end of a first interconnect layer trace 1014 whose other end extends proximally to couple to a corresponding top layer feed through pad 1016. The top layer feed through pad is electrically connected by a respective layer via 1018 through the first substrate layer 14 and second substrate layer 16 to the respective bump 1020. The respective bump 1020 provides connection to a corresponding circuit board connection pad. The interconnect trace 1014 passes through the inner ring R1 by means of a respective gap 1022 (FIG. 9a) formed between adjacent ring segments R13 and R12. Segmenting inner ring R1 into spaced apart segments permits interconnect traces such as this trace 1014, to couple outer ring segments such as R21 to package electrodes [that is the metallic bumps] 954 that are located within the periphery defined by the inner ring R1.

The wire bond connecting the chip pad 1010 to the outer ring segment does not require a corresponding package bonding pad. Thus the annular section of the package bonding array otherwise assigned to package bonding pad for that wire bond may be designated instead to provide the gap through which the interconnect trace 1014 may pass from the outer ring segment to the proximally disposed top player feed through pad.

This structure provides the flexibility that is one of the key features of the present invention. The outer ring segment R21 may be used for power, ground, or a critical signal, as desired because of the freedom provided by the optional placement of the top layer interconnect trace. There is a great deal of flexibility in the choice of location for the proximal and distal end of the top layer interconnect trace connecting between a given outer ring segment and a selected one of the top layer feed through pads. This theoretically gives a system designer essentially no restriction in placement of a chip-bonding pad relative to a selected circuit board bonding pad. Those knowledgeable in the arts of circuit layout will readily see the increased flexibility provided by the segmented inner rings for coupling chip bonding pads to the selected chip package pins. Multiple chip bonds to the same outer ring segment can be made as shown by the other outer ring bond wire chip pad bond wires to chip package pin. Similarly the other outer ring segments may also combined to provide connection from selected chip bonding pads to corresponding selected package bonding pins. Separate outer ring segments may be coupled by corresponding top layer interconnect traces to connect individually to selected single package bonding pins or may be commonly coupled by the corresponding top player interconnect traces to one or more selected package bonding pins by suitably arranging the location of the traces and their respective opposite connecting ends.

This solves the problem of connecting multiple chip bonding pads distributed at opposite ends of one side of the chip or on opposite sides of the chip to a selected single one of multiple power supply sources or a selected single one of multiple ground connections. Each chip pad of a group of chip pads that is identified with a single power supply or ground connections may be connected via wire bond to the same outer ring segment. That same outer ring segment in turn, may be connected by a corresponding combination of a top layer interconnect trace, a corresponding top layer feed through pad, and a metallic feed through connection to the corresponding package bonding pin.

Alternatively, selected subsets of chip pads of a group of commonly identified power chip pads may be bonded to selected ones of corresponding spaced apart outer ring segments. The corresponding outer ring segments may be individually coupled from respective proximal ends of corresponding separate top layer interconnect traces that are commonly coupled at their respective opposite ends to a corresponding single package power pin.

Figure 11:
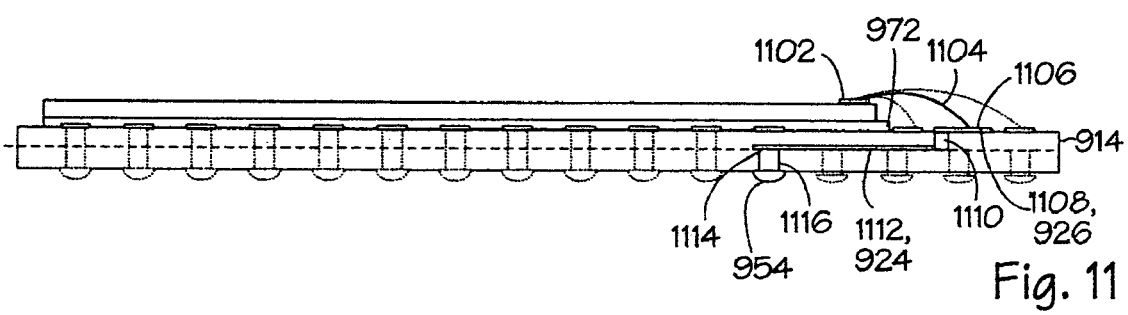

FIG. 11 shows another connection from a chip-bonding pad 1102 to another metallic bump 954. The chip-bonding pad 1102 is connected by a bonding wire 1104 to package bonding pad 1106. This package bonding pad is extended as a trace 1108 formed in top layer 926 to couple with a corresponding top layer via 1110 through the first substrate layer 914. The via 1110 couples at its opposite end with one end of a corresponding interconnect trace 1112 formed in the intermediate interconnect layer 924. The other end of the interconnect trace 1112 couples through a corresponding intermediate layer feed through pad 1114. Feed through pad 1114 joins with corresponding second layer via 1116 defined in the second substrate layer 916. The other end of the respective via 1116 connection is coupled to a corresponding metallic bump 954 for connection to another circuit board bonding pad.

Generally, a substantial majority of chip bonding pads make connection to package bonding pins by means of the vias defined in the first substrate layer and the corresponding feed through metal connections and intermediate layer routing traces. This type of connection is most appropriate for signals having greater tolerance for parasitic effects, that is, series resistance, inductance, shunt capacitance, signal cross coupling, interference and the like.

Figure 12:
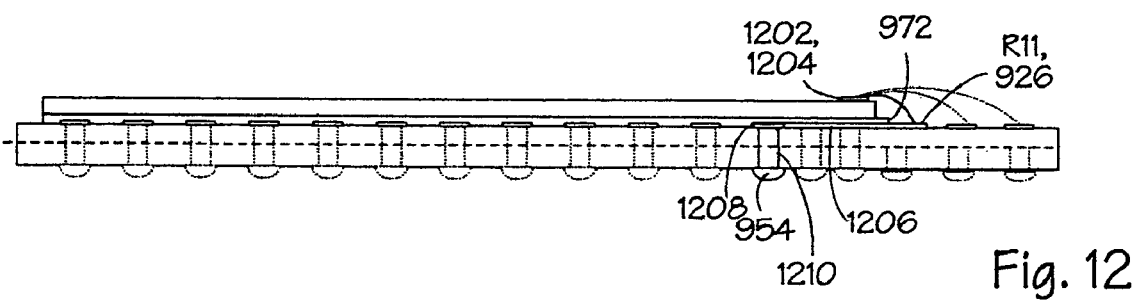

FIG. 12 shows another means of electrical connection provided by the inner rings of the present multi-power ring invention for connecting from selected chip power bonding pads or critical signal bonding heads to other selected package pins [metallic bump]. The inner ring segment R11 receives bonding wires from 2 chip bonding pads 1202, 1204. The inner ring segment R11 is coupled to one end of the corresponding top layer interconnect trace 1206. The interconnect trace 1206 extends proximally inward to its opposite end where it couples to a corresponding top layer feed through pad 1208. The top layer feed through pad 1208 couples to a selected via 1210 that extends through both substrate layers and terminates at the corresponding bump 954.

FIG. 13 shows a connection from a die bonding pad to a package bump inside the inner ring looking at the cross section taken along 13—13 in FIG. 9a. The pad 1302 connects to the outer ring segment R21 by wire bond 1304. A top surface trace 1306 connects through the inner ring R1 between segments R11 and R12 to join the outer ring segment R21 to top layer via pad 1308. Via pad 1308 connects through a selected via 1310 to the selected package bump 954.

Connections through the inner ring group R1 from other selected chip bonding pads may be made by respective wire bonds from the pads to other respective inner ring segments. Each inner ring segment may have one or more bonding wires joined to respective chip bonding pads. As in the case of the outer ring segments, individual inner ring segments may be coupled by their respective combination of top layer interconnect trace, top layer feed through pad, metal feed through connection, and corresponding metallic bump to form separate connection with different circuit board bonding pads. Alternatively, multiple spaced apart chip bonding pads that are identified with a single power supply or ground connection may be separately bonded to respective individual spaced apart inner rings that have respective separate top layer interconnect traces whose extended distal ends are commonly connected to a single top layer feed through pad for connection with the corresponding power supply or ground.

Another alternative embodiment of the present invention for connections from multiple chip bonding pads identified with a particular common power supply or ground connection is provided by selecting subsets of the group of commonly identified chip bonding pads. Each selected subset of commonly identified chip bonding pads is individually wire bonded to corresponding selected inner ring segments that are individually connected by a respective combination of top layer interconnect trace, top layer feed through pad, metal feed through connection and corresponding metallic bump, to individual circuit board bonding pads. The individual circuit board bonding pads may then be commonly coupled to the identified power supply or ground connection by the circuit board conductive interconnect metal or by separate wires (not shown).

A plurality of inner ring segments and A plurality of outer ring segments disposed concentric with the annular bonding pad array provide a great flexibility for choosing chip bonding pad power supply or ground connections for multiple system power supplies and multiple system ground supplies. System Power or ground can be assigned to either inner- or outer-ring segments with different power supplies arranged in the adjacent segments or alternate power and ground segments within the same ring. The separation of the inner ring segments provides one or more gaps for the passage of top player interconnect traces from the outer ring segments to interior top layer feed through connection to the package pins.

By selecting the pattern of the arrangement of the top layer interconnect traces and the pattern of the intermediate layer interconnect traces an essentially unlimited set of possible connections between any chip bonding pad location and any package bonding pad location can be made.

It will be apparent to those knowledgeable in the art of circuit design and layout that the present invention optionally can provide more than one group of inner rings and more than one group of outer rings to be utilized by embodiments of the present invention. Extensions of the principles disclosed in the embodiments described are clear: the first principal of separated ring segments provides for flexible connection to multiple system power supplies or ground supplies and or special critical signal performance enhancement. The separation between adjacent ring segments provides flexibility in locations for passage of interconnect traces coupling an outer or distal ring to an inner or proximal package pin where the ring segments, the interconnect traces, the outer ring segments and the connection to the inner package pin are all in the same interconnect layer plane.

The intermediate interconnect metal layer and the associated first substrate layer vias and second substrate layer vias provides flexibility in connection from the package bonding pads through the intermediate layer connection points to package pins without interrupting the top layer inner ring segments.

The present invention has been described with regard to a wire bonded chip scale IC and micro-BGA package. Embodiments of the present invention in flip chip (ball bonded chips), Tab mounted chips, beam lead chips, and gold, aluminum, and copper wire or lead bonds between package bonding pads and chip bonding pads are understood to be alternatives and are not limited by the ball grid array description.

For embodiments of the present invention with a single package (top) layer of metal interconnect the routing from the outer ring segments to the package pins is not problematic because the top layer interconnect routing trace from the outer ring advantageously uses annular space (the separation gap) that was given up by the lack of the bonding wire that would previously have made a connection from the outer ring toward the interior of the chip.

It is apparent to those skilled in the art that alternative embodiments of the present invention include multi-power ring structures that have more than one annular power ring group disposed inside or outside of the chip bonding pad annulus The present multi-power ring chip scale package invention provides chip scale packages that have a periphery with outlines that extend only slightly larger than that of the chip mounted within them. The package outline that is the periphery of the package only has to be extended enough to include space for the group of inner ring segments and the group of outer ring segments. In wire bonded embodiments the package outline would already have allowance for the package bonding pads.

In summary: there are two aspects to the segmented Multi-power ring chip scale package invention No. 1] An outer segmented ring is disposed concentrically, outside of the package bonding pads, with each ring segment having at least one interconnect to a package pad [BGA ] located interior to the chip bonding pads. Optionally, the interconnect for all of the ring segments is formed in a single metal interconnect layer.

No. 2] An outer ring, or a plurality of segmented outer rings disposed concentrically outside of an annular array of chip bonding pads, and a ring or a plurality of segmented inter-rings is disposed concentrically inside of the array of chip bonding pads: Optionally a set of routing interconnect lines between each respective outer and inter-ring segments to a corresponding one of each BGA package pads, in which selected ones of the routing interconnect lines comprise interconnect traces that are disposed on different metal interconnect layers.

What is claimed is:

1. An Integrated Circuit (IC) package comprising:

An IC chip mounting surface periphery defining a chip mounting surface;

a first plurality of electrically isolated conductive package bonding lands distally spaced apart from said chip mounting surface periphery;

a second plurality of spaced apart, electrically isolated annular power-ring bonding segments;

each one of said second plurality of annular power-ring bonding segments being disposed and extended annularly along and disposed and extended distally from said IC chip mounting surface periphery to a respective annular extent and a respective distal lateral width, said annular extent and said lateral width defining a respective maximum available number (Nm) of sequentially ordered annularly spaced apart bonding locations;

wherein, for each of said second plurality of annular power-ring bonding segments, a respective selected combination (Nb) of sequentially ordered annularly spaced apart bonding locations may be selected from respective combinations of said Nm bonding locations at a time, where both Nb and Nm are integers and Nb is less than Nm; and whereby each said annular bonding segment provides a respective contiguous annular electrode for connecting respective ones of a corresponding set of Nb conductive members arranged in corresponding annularly spaced sequential order to corresponding annularly spaced sequentially ordered chip power bonding pads of a respective power net disposed on an IC chip mounted on said IC chip mounting surface.

2. A packaged Integrated Circuit (IC) comprising:
an Integrated Circuit having a plurality of IC signal bonding pads and a plurality of IC power bonding pads; and
an Integrated Circuit package comprising:
an IC chip mounting surface periphery defining an IC mounting surface upon which the IC is mounted;
a plurality of electrically isolated conductive package bonding lands distally spaced apart from the chip mounting surface periphery;
a plurality of conductive signal leads, each coupling a respective IC signal bonding pad to a respective package bonding land;
a plurality of spaced apart, electrically isolated annular power-ring bonding segments;
each one of the plurality of annular power-ring bonding segments being disposed and extending annularly along and disposed and extended distally from the IC chip mounting surface periphery to a respective annular extent and a respective distal lateral width, the respective annular extent and the respective lateral width defining a respective maximum available number (Nm) of sequentially ordered spaced apart bonding locations;
wherein, for each of the plurality of annular power-ring bonding segments, a respective selected combination (Nb) of sequentially ordered spaced apart bonding locations may be selected from respective combinations of the Nm bonding locations at a time, where both Nb and Nm are integers and Nb is less than Nm;
whereby each of the annular power-ring bonding segments provides a respective contiguous annular electrode having a corresponding set of Nb bonding locations available for electrical coupling to corresponding IC power bonding pads of the Integrated Circuit; and
a plurality of conductive power leads, each conductive power lead coupling a respective IC power bonding pad of the Integrated Circuit to a respective bonding location of a corresponding annular power-ring bonding segment.

3. The packaged Integrated Circuit (IC) of claim 2, wherein the plurality of spaced apart, electrically isolated annular power-ring bonding segments includes two segments, each of which services a respective power requirement of the Integrated Circuit.

4. The packaged Integrated Circuit (IC) of claim 2, wherein the plurality of spaced apart, electrically isolated annular power-ring bonding segments includes three segments, each of which services a respective power requirement of the Integrated Circuit.

5. The packaged Integrated Circuit (IC) of claim 2, wherein at least one of the plurality of spaced apart, electrically isolated annular power-ring bonding segments fully surrounds the IC chip mounting surface.

6. The packaged Integrated Circuit (IC) of claim 2:
wherein the IC chip mounting surface corresponds to a planar surface;
the plurality of spaced apart, electrically isolated annular power-ring bonding segments also correspond to the planar surface; and
the plurality of electrically isolated conductive package bonding lands also correspond to the planar surface.

7. The packaged Integrated Circuit (IC) of claim 2:
wherein the IC chip mounting surface corresponds to a first planar surface;
the plurality of spaced apart, electrically isolated annular power-ring bonding segments also correspond to the first planar surface; and
the plurality of electrically isolated conductive package bonding lands are disposed along a second planar surface that differs from the first planar surface.

8. The packaged integrated Circuit (IC) of claim 7, wherein. the first planar surface and the second planar surface are parallel to one another.

9. The packaged Integrated Circuit (IC) of claim 2, in which at least one of the plurality of electrically isolated conductive package bonding lands is disposed between the plurality of spaced apart, electrically isolated annular power-ring bonding segments and the IC chip mounting surface periphery.

10. The packaged Integrated Circuit (IC) of claim 2, in which at least one of the plurality of spaced apart, electrically isolated annular power-ring bonding segments is disposed between the IC chip mounting surface periphery and the plurality of electrically isolated conductive package bonding lands.

11. The packaged Integrated Circuit (IC) of claim 2, wherein at least one of the annular power-ring bonding segments is disposed and extended to an extent scaled to accommodate a design constraint selected from the group of functional architecture, bonding ease, manufacturing throughput and cost, system board layout constraints, operating performance levels, signal transition speeds, lead inductance, I/O driver noise, ground bounce, signal cross-coupling and signal isolation specification.

12. A packaged Integrated Circuit (IC) comprising:
an Integrated Circuit having a plurality of IC signal bonding pads and a plurality of IC power bonding pads; and
an Integrated Circuit package formed on a substrate assembly having opposed surfaces, the Integrated Circuit package comprising:
an IC chip mounting surface periphery located on a first surface of the opposed surfaces of the substrate assembly,
a plurality of spaced apart, electrically isolated annular power-ring bonding segments defined on the first surface of the substrate assembly;
each one of the plurality of annular power-ring bonding segments being disposed and extending annularly along and disposed and extended distally from the IC chip mounting surface periphery to a respective annular extent and a respective distal lateral width, the respective annular extent and the respective lateral width defining a respective maximum available number (Nm) of sequentially ordered spaced apart bonding locations;
wherein, for each of the plurality of annular power-ring bonding segments, a respective selected combination (Nb) of sequentially ordered spaced apart bonding locations may be selected from respedive combinations of the Nm bonding locations at a time, where both Nb and Nm are integers and Nb is less than Nm;
whereby each the annular power-ring bonding segments provides a respective contiguous annular electrode having a corresponding set of Nb bonding locations available for electrical coupling to corresponding IC power bonding pads of the Integrated Circuit;
a plurality of conductive power leads, each conductive power lead coupling a respective IC power bonding pad of the Integrated Circuit to a respective bonding location of a corresponding annular power-ring bonding segment;

a plurality of electrically isolated conductive IC bonding lands defined on the first surface of the substrate assembly;

a matrix of spaced apart package bonding pins disposed on a second surface of the opposed surfaces of the substrate assembly that is opposed to the first surface; and an arrangement of electrical connections between selected ones of the IC bonding lands and corresponding selected ones of the package bonding pins.

13. The packaged Integrated Circuit (IC) of claim 12, wherein the electrical connections include a plurality of interconnect traces defined on the first surface of the substrate assembly.

14. The packaged Integrated Circuit (IC) of claim 12, in which the electrical connections include at least one metallic connection extending through an aperture defined in the substrate assembly between the opposed surfaces.

15. The packaged Integrated Circuit (IC) of claim 12, in which at least one spaced apart, electrically isolated annular power-ring bonding segment of the plurality of spaced apart, electrically isolated annular power-ring bonding segments is electrically connected to a corresponding one of the package bonding pins.

16. The packaged Integrated Circuit (IC) of claim 12, in which a group of spaced apart, electrically isolated annular power-ring bonding segments of the plurality of spaced apart, electrically isolated annular power-ring bonding segments are electrically connected in common to a corresponding single package bonding pin.

17. The packaged Integrated Circuit (IC) of claim 12, in which each of a group of spaced apart, electrically isolated annular powet-ring segments of the plurality of spaced apart, electrically isolated annular power-ring segments is separately electrically connected to a corresponding separate package bonding pins.

18. The packaged integrated Circuit (IC) of claim 12, in which a plurality of ring segments of the plurality of spaced apart, electrically isolated annular power-ring bonding segments are electrically connected in common to a corresponding single package bonding pin.

19. The packaged Integrated Circuit (IC) of claim 12, wherein the plurality of spaced apart, electrically isolated annular power-ring bonding segments includes two segments, each of which services a respective power requirement of the Integrated Circuit.

20. The packaged Integrated Circuit (IC) of claim 12, wherein at least one of the plurality of spaced apart, electrically isolated annular power-ring bonding segments fully surrounds the IC chip mounting surface.

* * * * *

UNITED STATES PATENT AND TRADEMARK OFFICE
CERTIFICATE OF CORRECTION

| | |
|---|---|
| PATENT NO. | : 7,129,574 B2 |
| APPLICATION NO. | : 10/884055 |
| DATED | : October 31, 2006 |
| INVENTOR(S) | : Ping Wu |

It is certified that error appears in the above-identified patent and that said Letters Patent is hereby corrected as shown below:

Column 20, line 7, in Claim 8: capitalize the "i" in "integrated"

Column 20, line 8, in Claim 8: replace "wherein." with --wherein--

Column 20, line 57, in Claim 12: replace "respedive" with --respective--

Column 22, line 8, in Claim 17: replace "powet-ring" with --power-ring--

Column 22, line 13, in Claim 18: capitalize the "i" in "integrated"

Signed and Sealed this

Twenty-ninth Day of July, 2008

JON W. DUDAS
*Director of the United States Patent and Trademark Office*